United States Patent
Hsu et al.

(10) Patent No.: US 6,498,752 B1
(45) Date of Patent: Dec. 24, 2002

(54) THREE STEP WRITE PROCESS USED FOR A NONVOLATILE NOR TYPE EEPROM MEMORY

(75) Inventors: Fu-Chang Hsu, San Jose, CA (US); Hsing-Ya Tsao, San Jose, CA (US); Peter W. Lee, Saratoga, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 0 days.

(21) Appl. No.: 09/940,159

(22) Filed: Aug. 27, 2001

(51) Int. Cl.$^7$ .............................................. G11C 16/06
(52) U.S. Cl. .......................... 365/185.22; 365/185.18; 365/185.29
(58) Field of Search ...................... 365/185.22, 185.18, 365/185.29

(56) References Cited

U.S. PATENT DOCUMENTS

| | | | |
|---|---|---|---|
| 5,237,535 A | | 8/1993 | Mielke et al. ............... 365/218 |
| 5,687,120 A | * | 11/1997 | Chang et al. ........... 365/185.22 |
| 5,748,538 A | | 5/1998 | Lee et al. ............... 365/185.06 |
| 5,822,252 A | | 10/1998 | Lee et al. ............... 365/185.3 |
| 5,848,000 A | | 12/1998 | Lee et al. ............... 365/185.23 |
| 6,072,722 A | | 6/2000 | Hirano .................. 365/185.13 |
| 6,101,123 A | | 8/2000 | Kato et al. ............. 365/185.11 |
| 6,122,198 A | | 9/2000 | Haddad et al. ........ 365/185.22 |
| 6,366,501 B1 | * | 4/2002 | Thurgate et al. ....... 365/185.29 |
| 2002/0018368 A1 | * | 2/2002 | Visconti ................ 365/185.18 |

* cited by examiner

*Primary Examiner*—Huan Hoang
(74) *Attorney, Agent, or Firm*—George O. Saile; Stephen B. Ackerman

(57) ABSTRACT

The present invention discloses a novel method for erasing an ETOX type and an AND type NOR flash memory arrays. The operations of the methods includes block erase which increases the Vt of the memory cell, block erase verify to check if the Vt of the erased cell is greater than a predetermined voltage Vtoff, page reverse program which reduces the Vt of the memory cell below a predetermine voltage Vtmax, reverse program verify which checks that the Vt of the memory cell is below Vtmax, page correction which corrects the Vt of cells on a page basis to be above a predetermined voltage Vtmin, and correction verify which checks that the Vt of the memory cells is above Vtmin. According to the present invention, the erase operation is performed to increase the Vt of erased cells by applying the positive high voltages to the selected word lines with bit lines and source lines grounded. The reverse program operation is performed to decrease the Vt of erased cells by applying the negative high voltage to the selected word lines with the source lines and bit lines grounded. For the ETOX cell an FN tunneling scheme is utilized for the Erase operation and CHE for the correction operation. The AND cell uses FN tunneling for both erase and correction operations.

39 Claims, 15 Drawing Sheets

| | | Erase | Erase Verify | Reverse Program | Reverse-PGM Verify | Correction Verify | Correction |
|---|---|---|---|---|---|---|---|
| | BLn | 0V | +1V | 0V | 0V | 0V | 0V |
| | BLn+1 | 0V | +1V | 0V | +1V | +1V | +5V |
| Block 0 (selected) | BT1(0) | Vdd | Vdd | Vdd | 0V | 0V | 0V |
| | WL0(0) | +15V | Versvfy | -15V | Vrpgmvfy | Vcorvfy | Vcorr |
| | SL0(0) | 0V | 0V | 0V | 0V | 0V | 0V |
| | WL1(0) | +15V | Versvfy | 0V | 0V | 0V | 0V |
| | WL2(0) | +15V | Versvfy | 0V | 0V | 0V | 0V |
| | SLm(0) | 0V | 0V | 0V | 0V | 0V | 0V |
| | WL511(0) | +15V | Versvfy | 0V | 0V | Vdd | +10V |
| | BT2(0) | Vdd | Vdd | Vdd | 0V | 0V | 0V |
| Block n (non-selected) | BT1(n) | 0V | 0V | 0V | 0V | 0V | 0V |
| | WL0(n) | 0V | 0V | 0V | 0V | 0V | 0V |
| | SL0(n) | 0V | 0V | 0V | 0V | 0V | 0V |
| | WL1(n) | 0V | 0V | 0V | 0V | 0V | 0V |
| | WL2(n) | 0V | 0V | 0V | 0V | 0V | 0V |
| | SLm(n) | 0V | 0V | 0V | 0V | 0V | 0V |
| | WL511(n) | 0V | 0V | 0V | 0V | 0V | 0V |
| | BT2(n) | 0V | 0V | 0V | 0V | 0V | 0V |

FIG. 6

| | | Erase | Erase Verify | Reverse Program | Reverse-PGM Verify | Correction Verify | Correction |
|---|---|---|---|---|---|---|---|
| Block 0 (selected) | BLm | 0V | +1V | 0V | +1V | +1 | 0V |
| | BLm+1 | 0V | +1V | 0V | +1V | -1V | +5V |
| | BLm+2 | 0V | +1V | 0V | +1V | +1 | 0V |
| | BLm+3 | 0V | +1V | 0V | +1V | -1V | +5V |
| | BT1(0) | Vdd | Vdd | Vdd | Vdd | Vdd | +10V |
| | WL0(0) | +15V | Versvfy | -15V | Vrpgmvfy | Vcorvfy | Vcorr |
| | WL1(0) | +15V | Versvfy | 0V | 0V | 0V | +2.5V |
| | WL31(0) | +15V | Versvfy | 0V | 0V | 0V | +2.5V |
| | SL(0) | 0V | 0V | 0V | 0V | 0V | 0V |
| | ST1(0) | 0V | Vdd | Vdd | Vdd | Vdd | 0V |
| Block n (non-selected) | BT1(n) | 0V | 0V | 0V | 0V | 0V | 0V |
| | WL0(n) | 0V | 0V | 0V | 0V | 0V | 0V |
| | WL1(n) | 0V | 0V | 0V | 0V | 0V | 0V |
| | WL31(n) | 0V | 0V | 0V | 0V | 0V | 0V |
| | SL(n) | 0V | 0V | 0V | 0V | 0V | 0V |
| | ST1(n) | 0V | 0V | 0V | 0V | 0V | 0V |

FIG. 11

THREE STEP WRITE PROCESS USED FOR A NONVOLATILE NOR TYPE EEPROM MEMORY

BACKGROUND OF THE INVENTION

1. Field of the Invention

The present invention relates to a semiconductor memory and in particular to writing a one-transistor cell, NOR-type, nonvolatile memory array.

2. Discussion of Related Art

A typical one-transistor cell, NOR-type flash array is comprised of a plurality of cells disposed in multiple rows (word lines) and multiple columns (bit lines), and circuits that control a variety of memory operations. These memory operations include erase, program, correct, read, and verify. The drains of flash memory cells are connected together to the corresponding bit lines, which are selected by a y-decoder. The sources of the memory cells are typically connected to common source lines, and the gates are jointly tied to word lines which are selected by an X-decoder. For a CHE (channel hot electron) program operation in an ETOX, NOR-type flash array, +10V is transferred to the selected word line along with +5V and 0V applied to the selected bit line and source line, respectively. This causes, the Vt (threshold voltage) of selected cells to increase after the program operation is performed. In contrast to program operation, −10V and +5V are applied to the selected word lines and source lines, respectively, with the selected bit lines in a floating state during a block erase operation.

After cells have been erased, an erase verify is performed to detect any under erased cells that have threshold voltage, Vt, which is above a predetermined value, Vtmax. For example, Vtmax could be set to around +1.5V, and as long as one cell's Vt is above 1.5V, an erase pulse is further applied. A successful erase is defined when the Vt of all cells being erased is below +1.5V. Due to the variations of the characteristics of the cells, some cells will be erased faster with their Vt going below a minimum voltages, Vtmin, during erase operation. For example, Vtmin is typically set to be +0.5V, and some cells are erased to a negative threshold voltage, these cells are called "over-erased cells". As a result, a leakage current will occur and false data will be read.

In U.S. Pat. No. 6,122,198 (Haddad et al.) a method is directed toward erase verify and over erase verify by using a bit-by-bit approach. The threshold voltage of each memory cell is compared to the Vt of a reference cell and an over erase correction pulse is applied to the column containing the over erased cell. The over erase correction is a type of program operation but using a lower voltage applied to the selected word line, which contains over erased cells, to bring the negative Vt of the over-erased cells back to acceptable positive range. As seen from FIG. 1 of prior art, $I_{BL}$ is the total bit line current generated from the sum of $I_1$, $I_3$ and $I_4$ when cell 504 is being erase verified, corrected, or programmed. The cells 502, 506 and 508 conduct with $I_1$, $I_3$ and $I_4$ leakage current, respectively, due to the negative Vt after erase. Cells of 502, 506 and 508 are referred as over-erased cells. The current $I_1$, $I_3$ and $I_4$ varies with bit line voltage, VD. During erase verify read, VD is approximately +1V, and current $I_1$, $I_3$ and $I_4$ will be increased when the voltage VD is increased during the program or correction operation. The leakage current IBL may exceed the supply capability from an on-chip charge pump circuit. As a consequence, the over erased cells render the program and correction operations inoperative. Similarly, the over erase induced leakage current shown in FIG. 2 of prior art can cause the erase verification not to perform correctly. If the sum of leakage current $I_1$, $I_3$ and $I_4$ caused by the over erased cells is higher than the contact current of an ON cell, all the cells will be read as an ON cell, then the erase verification is always falsely passed.

FIG. 3 shows a flow diagram of prior art for detecting and correcting over erased cells. The column address is set to the first column within the array 100 and an address counter is set to zero 102. A bad column flag is set to false 104 and the row address is set to the first cell in the column 106. The addressed cell is measured to determine if the cell is over erased 108. If the cell is over erased 108, the over erased cell is programmed with a single pulse 110 and the bad column flag is set to true 112, after which it is determined if the cell is the last cell in the column 114. If the cell is not over erased 108, it is determined if the cell is the last cell in the column 114. If the cell is not the last cell in the column 114, the row address is incremented 116 and the next cell in the column in measured for an over erase state 108. If the cell is the last cell in the column 114 and if the bad column flag is true 118, a counter is incremented 120, and if the count exceeds a predetermined amount 122, the repair fails and the process ends. If the count does not exceed a predetermined number 122, the bad column flag is set to false 104 and the process is repeated. If the bad column is not true 118 and if the column is the last column 126, the process is complete 125. If the bad column is not true 118 and if the column is not the last column 126, the column address is incremented 128, the address counter is set to false 102 and the process is repeated on the next column. Because of the leakage current from other cells in a column as noted in FIG. 2, the cell 704 being measured for over erase cannot be accurately be verified; therefore, the procedure of FIG. 3 will not work properly.

In FIG. 4A a flow diagram of prior art is shown for a bit-by-bit erase verify. The row address is set to the first row address 402, and the column address is set to the first column address 404. An erase verify is performed 406 on the addressed bit. If the addressed bit is under erased 408, an erase pulse is applied to the memory array 409 and the addressed cell is erase verified 406. If the addressed cell is not under erased 408, and if it is not the last column 412, the column address is incremented 410, and the addressed bit in the next column is erase verified 406. If it is not the last column 412, the row address is incremented 414, and the column address is set to the first address 404. If it is the last row 416, the row address is set to the first address 418 shown in FIG. 4B.

In FIG. 4B is shown a flow diagram of prior art for a bit-by-bit over erase detection and correction. After the row address is set to the first address 418, the column address is set to the first column address 420, and the addressed cell is verified to be erased 422. If the threshold voltage Vt of the addressed cell is not greater than a predetermined minimum 424, an over erase correction pulse is applied to the addressed column 426, and the address cell is again verified 422. If the threshold voltage Vt of the addressed cell is greater than a predetermined minimum 424, and if it is not the last column, the column address is incremented 428. If it is the last column 430, the row address is incremented 432. If it is not the last column 430, the addressed cell in the next column is verified for an erased Vt which is greater than a predetermined minimum 422. If the last row has not been attained 434, the column address is set to the first address 420 and the process continues. If the last row has been attained 434, the row address is set to the first row 436 as shown in FIG. 4C.

Shown in FIG. 4C is a flow diagram of prior art for a bit-by-bit under erase detection and correction. After the row address is set to the first address 436, the column address is set to the first column address 438. The addressed cell is erase verified 440. If the addressed bit is under erased 442, an erase pulse is applied to the array 443, and the cell is again erase verified 440.

If the addressed bit is not under erased 442, the column address is incremented 444, and if it is not the last column 446, the next address bit is erased verified 440. If it is the last column 446, the row address is incremented 448. If it is not the last row 450, the column address is set to the first address 438 and the process is repeated. If it is the last row address 450 and if there were no erase pulses applied in step 443, then the process is complete, else the row address is set to the first address 418 in FIG. 4B and the process is repeated.

U.S. Pat. No. 6,101,123 (Kato et al.) is directed toward programming and erasing a nonvolatile semiconductor memory using a tunneling mechanism. A negative word line voltage permits a lower drain voltage that reduces degradation on gate oxide during programming. U.S. Pat. No. 6,072,722 is directed toward programming and erasing a nonvolatile storage device where electrons are added or removed from a floating through a tunnel oxide. U.S. Pat. No. 5,848,000 (Lee et al.) is directed toward a novel latch structure in a flash memory address decoder to provide high accuracy and flexibility during the read, program and erase operations of a flash memory. U.S. Pat. No. 5,822,252 (Lee et al.) is directed towards a flash memory and decoder to overcome memory cell over erase problems. U.S. Pat. No. 5,748,538 (Lee et al.) is directed toward methods for programming and erasing a memory cell array of a flash EEPROM read only memory. In U.S. Pat. No. 5,237,535 (Mielke et al.) a method is directed towards repairing over erased memory cells in a flash memory array.

SUMMARY OF THE INVENTION

An objective of the present invention is to eliminate the leakage current from unselected memory cells which make flash memory operations comprising erase, erase verify, reverse program, reverse program verify, correction and correction verify.

Another objective of the present invention is to provide a tightened threshold voltage distribution utilizing methods of hot carrier injection and Fowler-Nordheim tunneling.

Yet another objective of the present invention is to decrease the voltage threshold of selected cells on a word line by word line basis.

A further objective of the present invention is to apply a ramped correction voltage to selected cells that have been correction verified eliminating any improper identification.

Still another objective of the present invention is to apply a correction pulse with a ramping time of less than one microsecond.

Still yet another objective of the present invention is to provide a memory device with savings in power consumption.

The present invention provides a solution to the previously mentioned drawbacks of the prior art comprising erase, erase verify, reverse program, reverse program verify, correction verify and correction operations in which leakage current is eliminated which avoids an erroneous read operation and cell misidentification during verify. An erase operation is carried out by applying +15V to selected word lines with associated bit lines and source lines grounded. This causes all memory cells will be erased to a high Vt state (Vt>Vtoff) after an iterative erase and verification operations, where Vtoff is the minimum threshold voltage for the erase state. Next cells are reverse programmed to lower the Vt of the cells to below a threshold voltage of Vtmax, where Vtmax is the highest reverse programmed threshold voltage. In the present invention, the reverse program is performed on page-by-page basis so that only one cell per bit line is selected which greatly reduces the leakage current and prevents the previously noted leakage problem of prior art. After the reverse program, selected cells are programmed to a narrow distribution of a high Vt state with Vt>Vtoff.

The reverse program is accomplished by applying a negative voltage to a selected word line with the bit lines and source lines grounded or floating. Reverse programming decreases the Vt of the cells to a voltage below Vtmax and for some cells to below Vtmin, which become over-erased cells. Since reverse programming is done on a page basis, only one cell for each bit line is selected which for all practical purposes eliminates any leakage current from unselected cells, and the reverse program operation can be supported by an on chip charge pump.

Unlike conventional over erase correction schemes where the number of over erased cells is crucial, a boosted word line voltage is required in the read operation and Vtmax cannot be set too low. The present invention allows Vtmax to be set at a low value, e.g. 1.5V, and Vtmin can be set at a lower value, e.g.0.5V. Thus the distribution of threshold voltages (Vt) can be tightened to a narrow range, bounded by Vtmax and Vtmin. By utilizing the hot carrier injection mechanism or Fowler-Nordheim tunneling scheme on two different corresponding arrays, ETOX-type or AND-type NOR arrays, the correction can be carried out by applying a ramped voltage on the selected word line to bring the over erased Vt cells back to an erased state. The number of the over-erased cells is very critical to conventional flash operations. Vtmax is typically set at a higher value to reduce the number of over-erased cells. As a consequence, a high current-consumption boosted word line voltage is required and wide Vt distribution cell is generated.

BRIEF DESCRIPTION OF THE DRAWINGS

This invention will be described with reference to the accompanying drawings, wherein:

FIG. 6 is a table of bias conditions applied to word lines, bit lines and source lines in the ETOX NOR array shown in FIG. 5;

FIG. 11 shows a table of bias conditions applied to word lines, bit lines and source lines in AND-type NOR array of FIG. 10 during different operations.

DETAILED DESCRIPTION OF THE PREFERRED EMBODIMENTS

Figure 1:
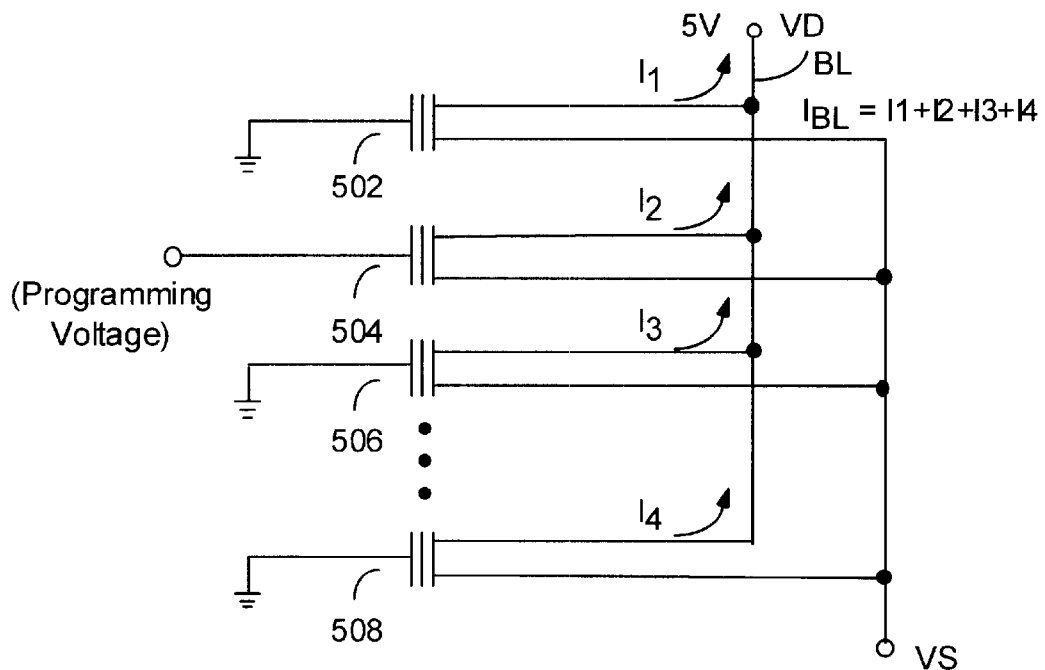
FIG. 1 shows a column of cells of prior art during programming failure of the addressed cell due to bit line leakage caused by over erased cells in prior art.
Figure 2:
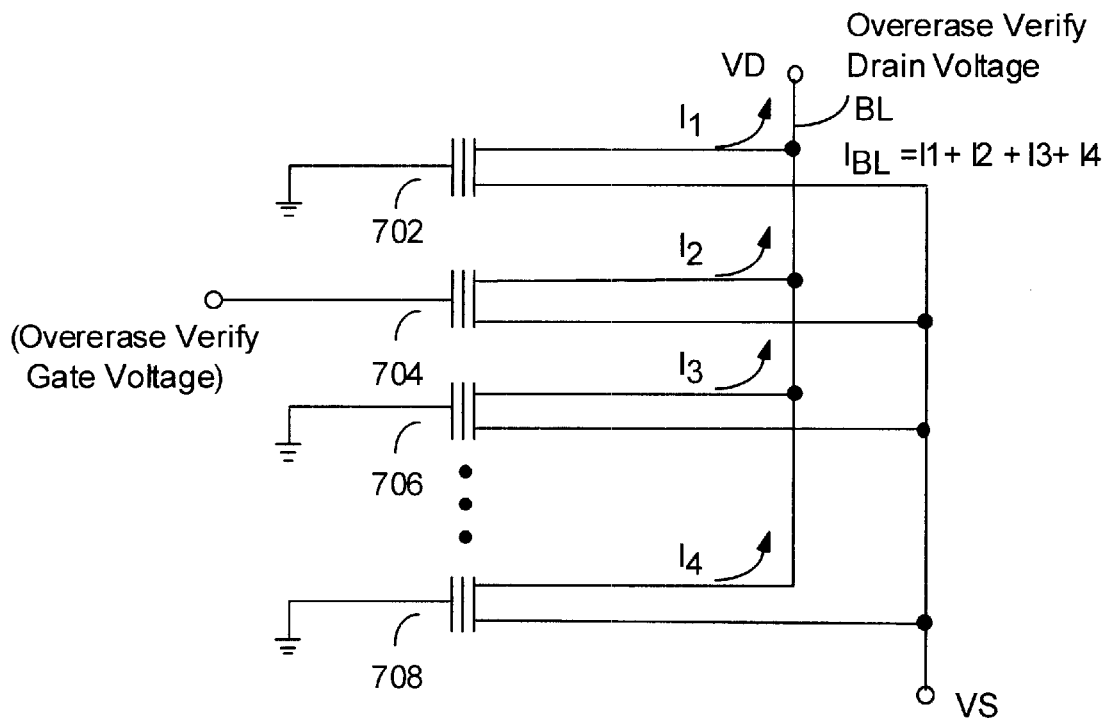
FIG. 2 shows a column of cells of prior art with leakage current from cells during an over erase verify operation.
Figure 3:
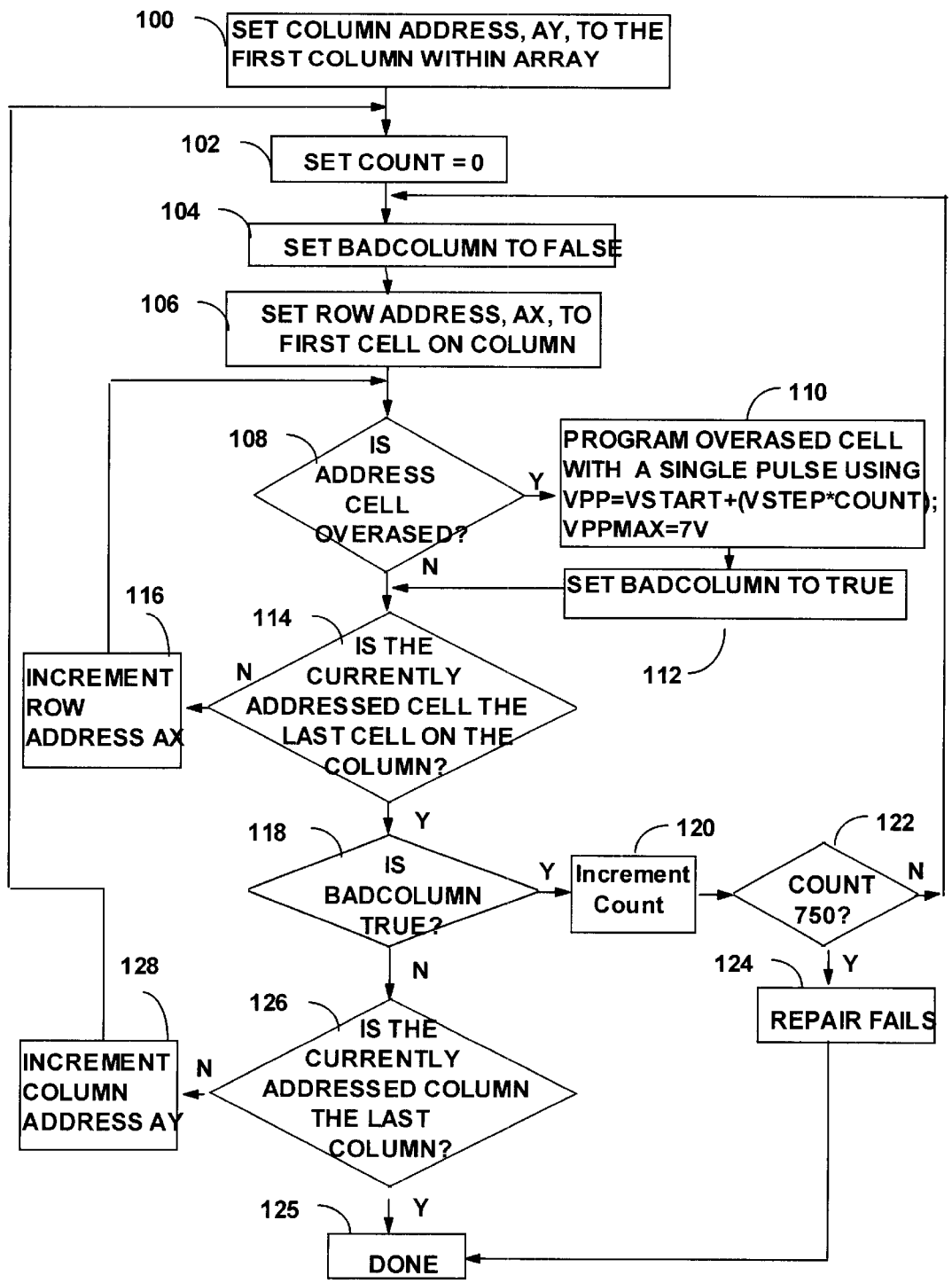
FIG. 3 is a flowchart of prior art for a first erase and over erase correction method.
Figure 4A:
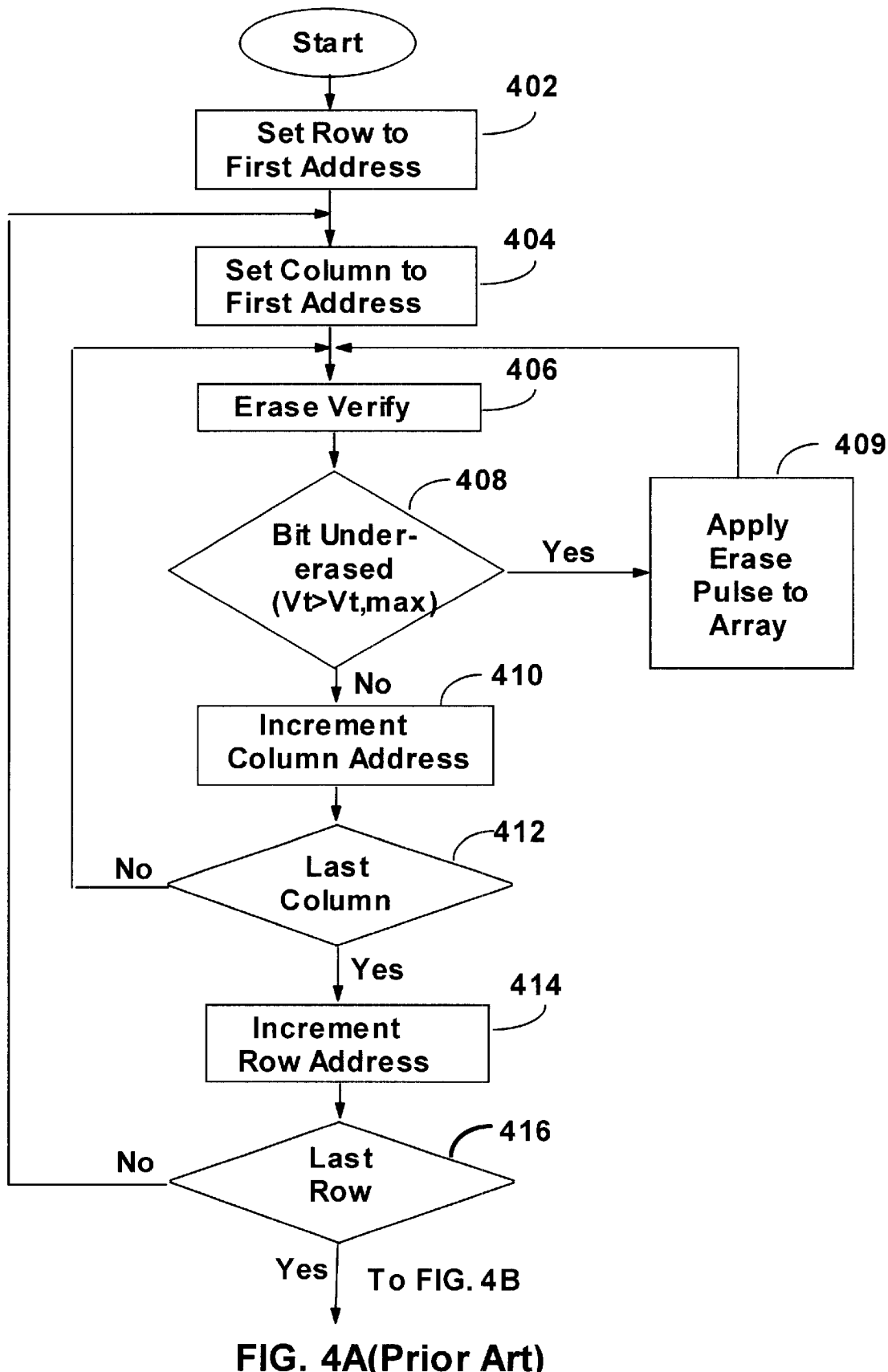
FIGS. 4A, 4B and 4C show a flowchart of prior art for a second erase and bit-by-bit over erase correction method.
Figure 4B:
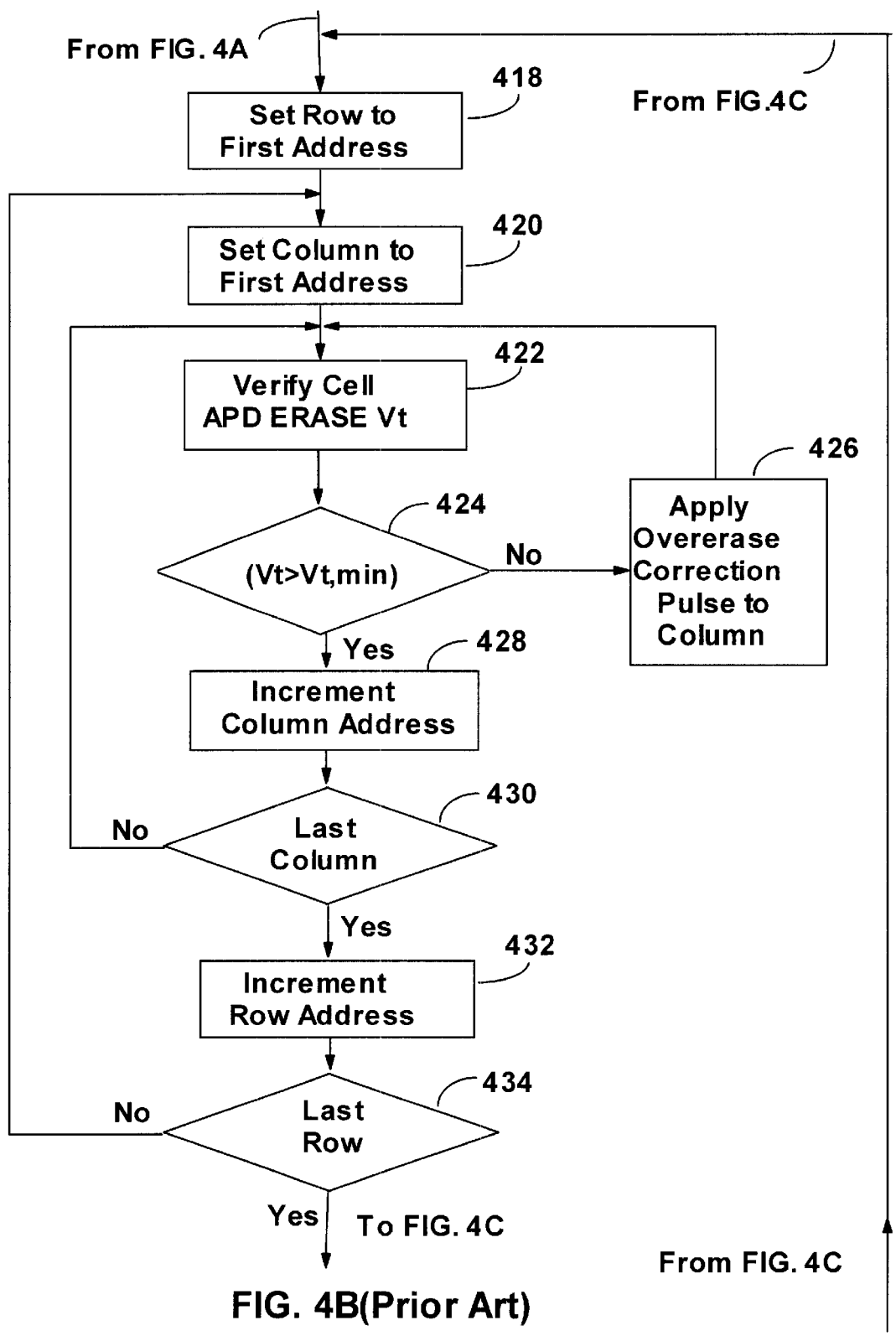
Figure 4C:
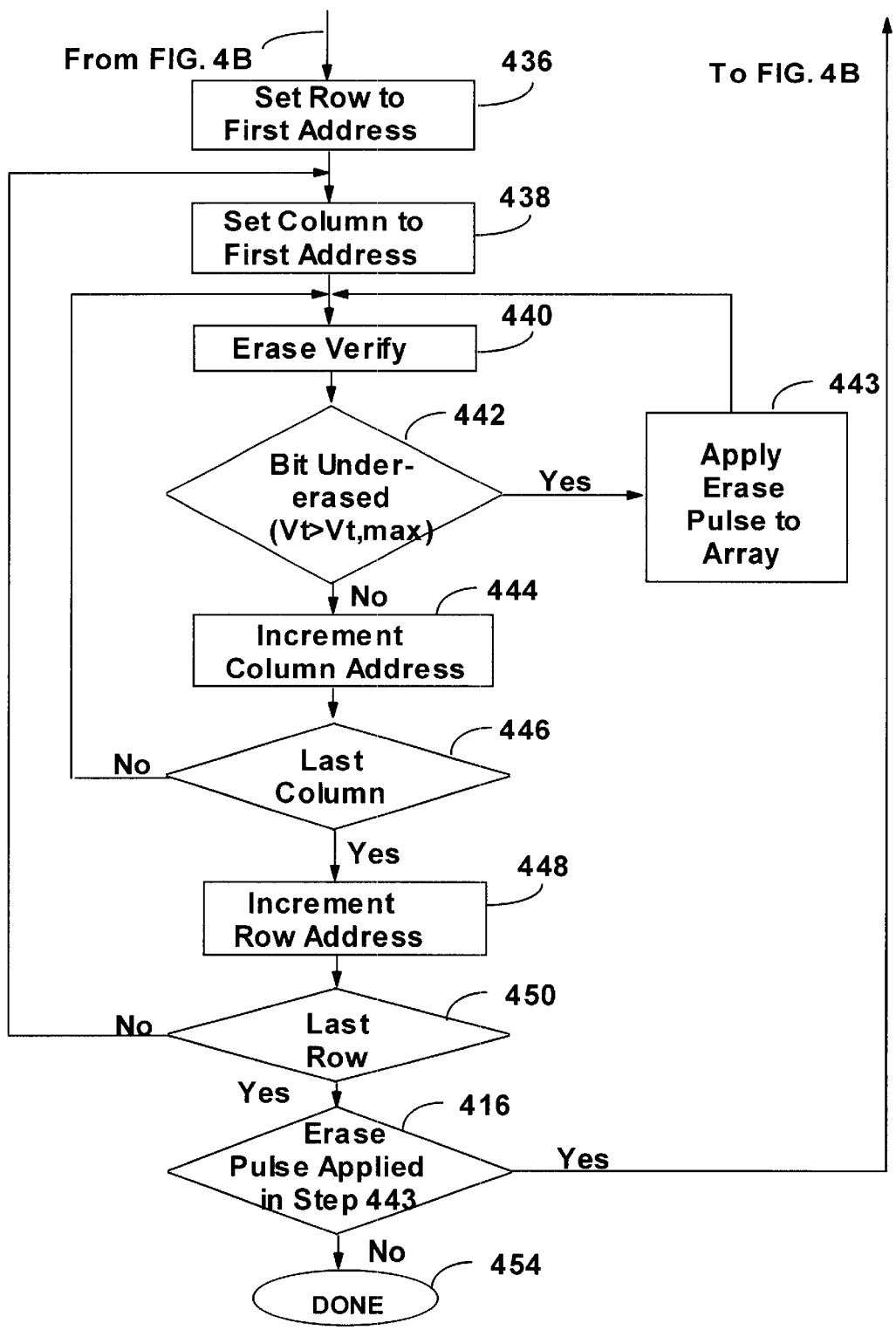
Figure 5:
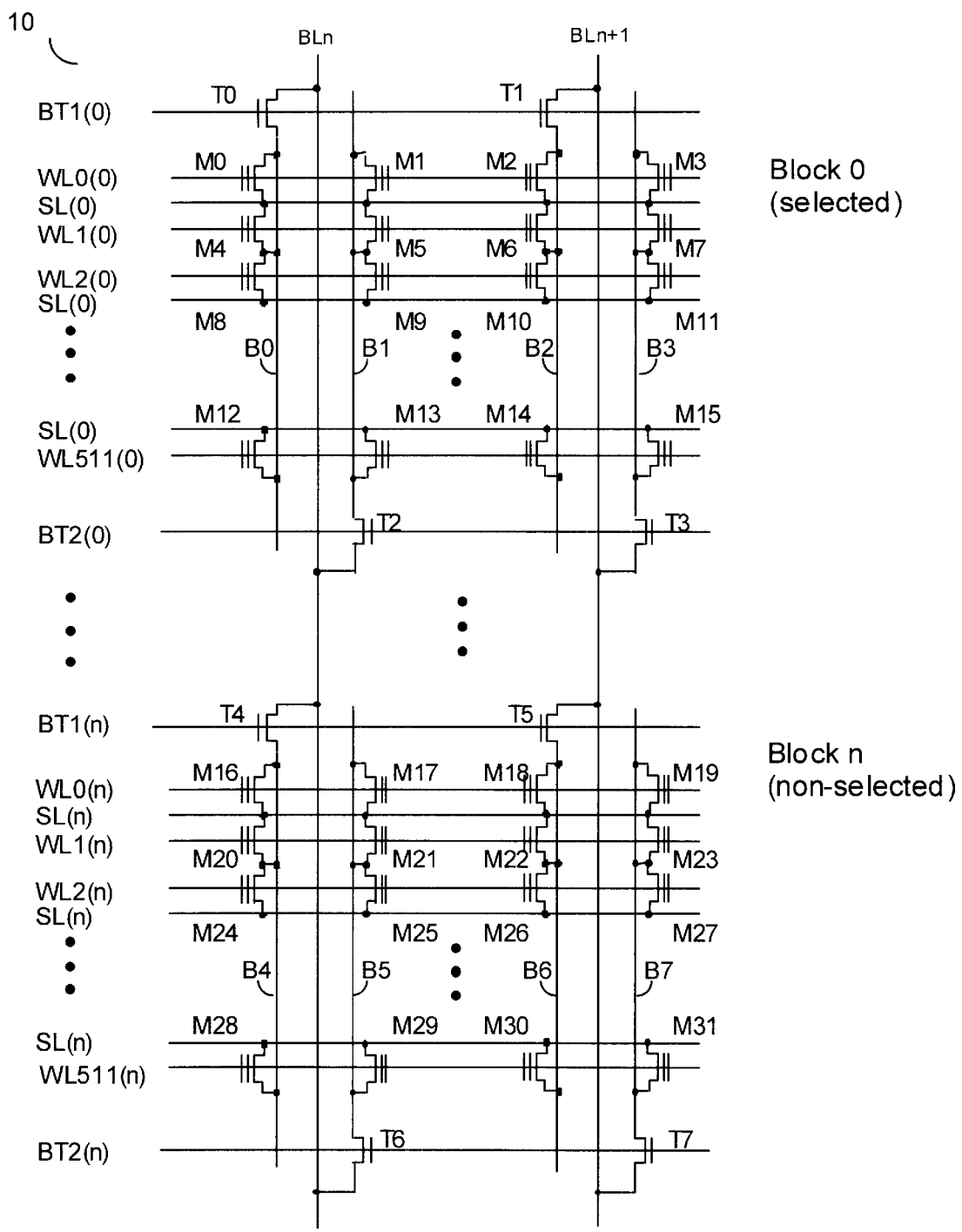
FIG. 5 shows an ETOX NOR array on P-substrate for selected and non-selected blocks in the present invention.

Shown in FIG. 5 is an ETOX NOR array 10 comprising a plurality of cells arranged in a plurality of rows and columns. Cells in a row are connected to word lines (WLm (n)) and cells in columns are connected to bit lines (BLn, BLn+1). The gates of cells are connected to the word lines and the drains are connected to bit lines. The ETOX NOR array can be divided into blocks, block 0; the selected block comprising cells M0 through M15; and block n, the unselected block comprising cells M16 through M31. Sources of the cells in the same block are connected to the common source lines SL(n). The drains of cells in the same block are connected to the sub-bit lines (B0, B1, B2, B3, B4, B5, B6 and B7) and coupled to the global main bit line, BLn or BLn+1, by a bit line select transistor T0 through T7. Transistors T0 and T1 are selected by BT1 (0), T2 and T3 are selected by BT2(0), T4 and T5 are selected by BT1 (n) and Hand T7 are selected by BT2(n). Block 0 is designated the selected block and Block n is designated a non-selected block.

Referring to FIG. 6, a table of the preferred bias conditions is shown for the array 10 of FIG. 5 for erase, erase verify, reverse program, reverse program verify, correction verify and correction operations. The table is divided into two sections, the selected block (block 0) and the non-selected block (block n). For each operation voltages are shown for the global bit lines BLn and BLn+1; the bit line selector signals BT1(0), BT2(0), BT1(n) and BT2(n); word lines WL0(0) through WL511(0) and WL0(n) through WL511(n); and source lines SL0(0), SLm(0), SL0(n) and SLm(n).

Continuing to refer to FIG. 6, the erase operation is a block erase, and therefore, all the word lines of the selected block, block 0, are coupled to a high positive voltage shown as +15V. The source lines SL0(0) and SLm(0) are coupled to 0V while the bit line selectors, BT1(0) and BT2(0), are activated with +Vdd coupling the 0V on the global bit lines to the local bit lines B0 through B3. All voltages coupled to the non-selected block, block n, are set to 0V. The cells are erased by Fowler-Nordheim (FN) tunneling. In the erase verify operation is done on a page basis and cells M0, M1, M2, and M3 are selected. An erase verify voltage, Versvfy, is coupled to word line WL0(0) which is coupled to cells M0, M1, M2, and M3 In the reverse program operation cells M0 through M15 are selected. A high negative voltage, approximately −15V, is applied to word line WL0(0) to effect an FN tunneling of electrons from the floating gates of the cells. In reverse program verify, correction verify and correction only cell M3 is selected. This can be seen by the global bit line voltages where BLn=0 and BLn+1=1V, 1V and 5V and bit line selector BT1(0)=0 and BT2(0)=Vdd, Vdd and +10V. A voltage Vrpgmvfy is applied to the word line WL0(0) containing cell M3 to effect the reverse program verify, and Vcorvfy is applied to word line WL0(0) to effect the correction verify operation. A voltage Vcorr is applied to word line WL0(0) to cause the Vt of cell M3 to be corrected from an over erased condition. a voltage +10V is applied to the bit line selector to support the +5V coupled to the global bit line BLn+1.

Continuing to refer to FIG. 6, the bit lines, word lines and source lines of all the cells in the non-selected blocks are coupled to 0V to prevent cell disturb conditions. Also non selected cells in the selected block have 0V bias to prevent the stored dated from being disturbed.

Figure 7A:
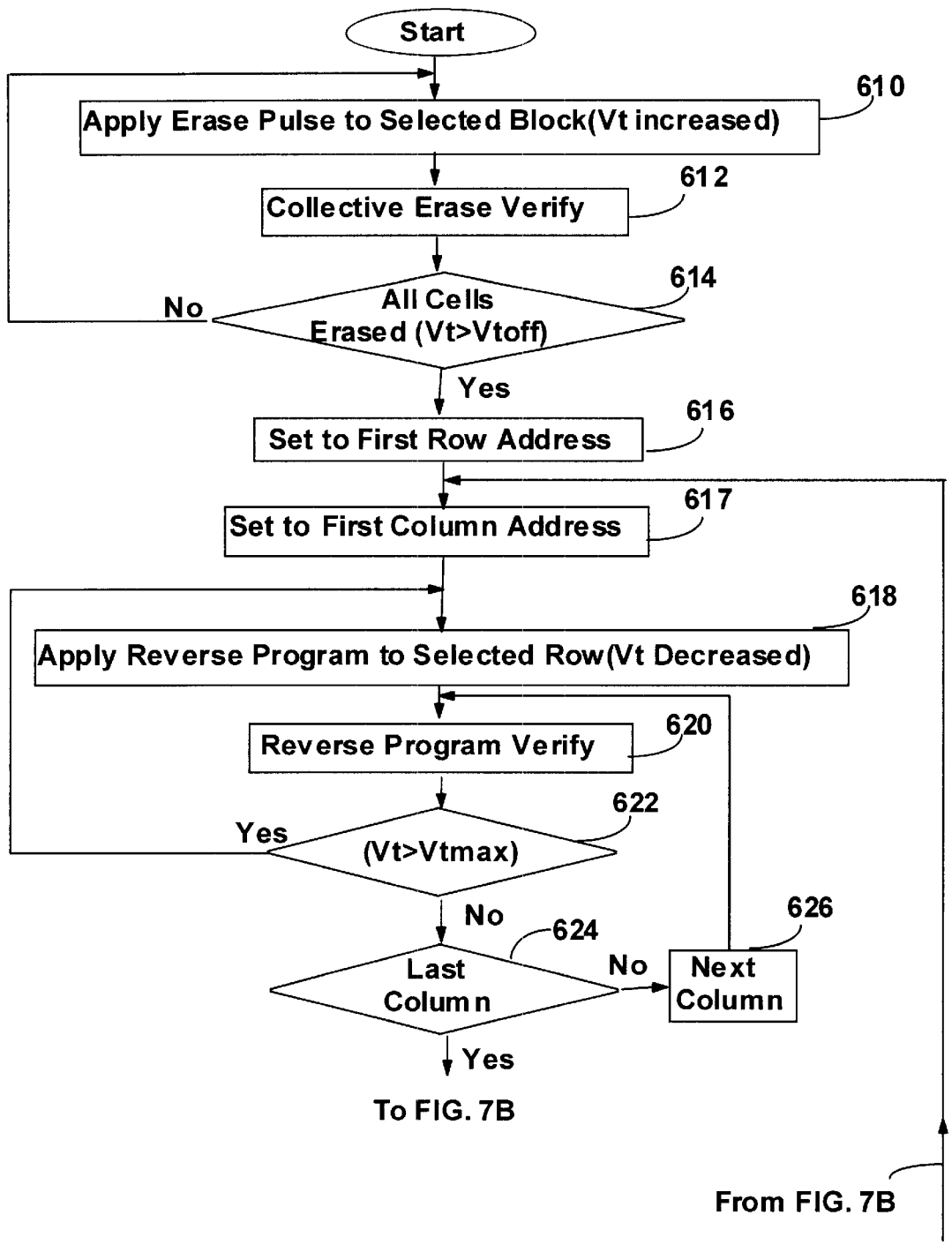
FIGS. 7A and 7B illustrate a flow chart of the present invention for erase, verify and correction applied to an ETOX NOR array.
Figure 7B:
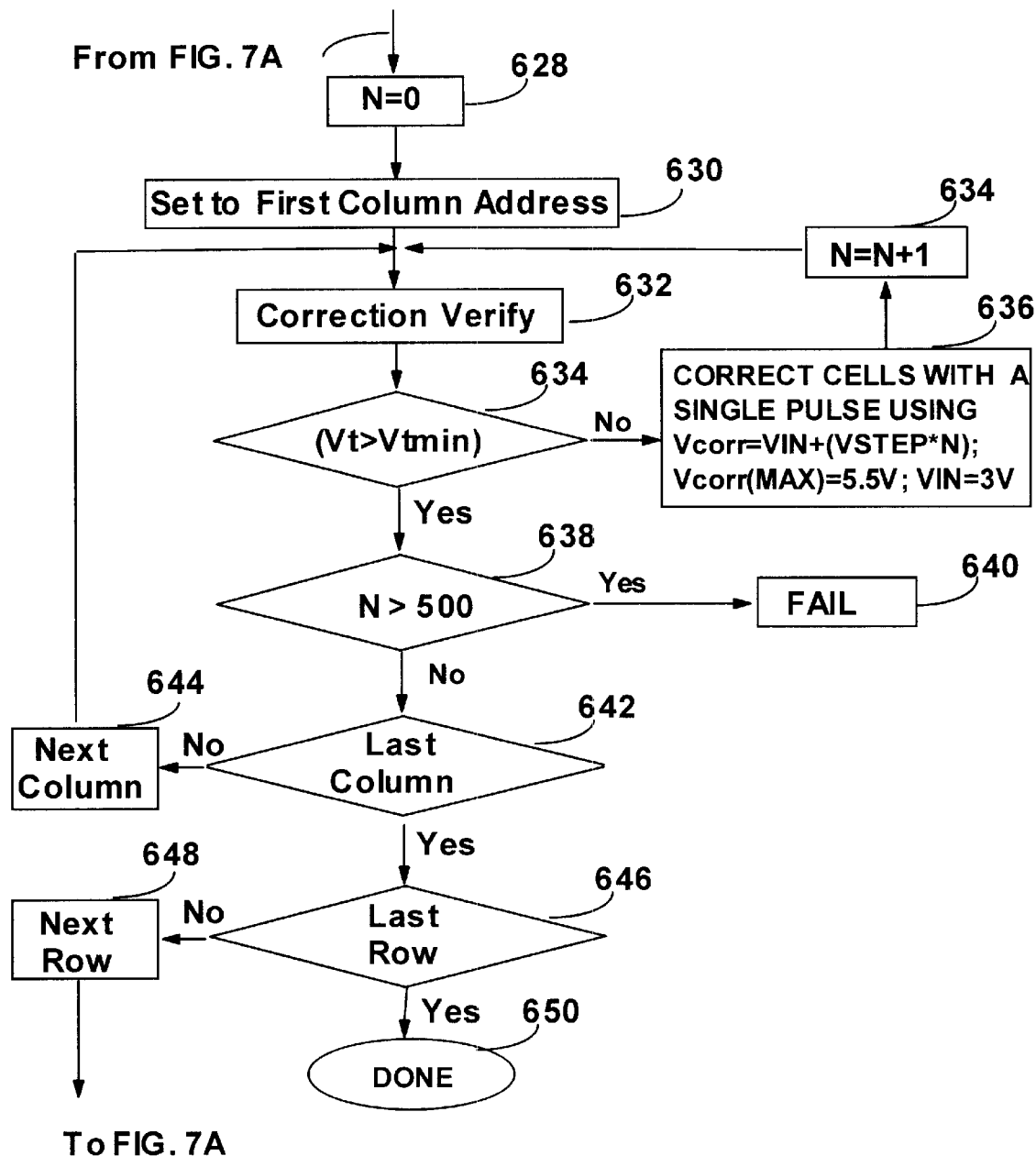

FIGS. 7A and 7B show a flow diagram of the present invention This flow diagram discloses the operations of erase, collective erase verify, reverse program, reverse program bit-by-bit verify, bit-by-bit correction verify and correction for an ETOX-type NOR flash array. An erase pulse of +15V is coupled to the selected rows of the flash memory comprising word lines WL0(0) to WL511(0) for erase operation 610 and a bit line voltage of 0V is coupled to bit lines BLn and BLn+1 of the selected Block 0. Since Vdd is coupled to BTI(0) and BT2(0) as shown in FIG. 6, transistors T0–T3 are turned on and a bit line voltage of 0V is coupled to the drains of the selected cells. The source line SL(0) is also coupled to 0V. This bias condition erases the selected cells M0–M15 by increasing the Vt of the cells. After initial erasure, all rows in the selected block are coupled to a voltage level, Versvfy, to perform a collective erase verify operation 612. An erase pulse 610 is coupled to the selected word lines until the erase verify 612 detects that the Vt of all the selected cells is above Vtoff. When the Vt of all memory cells in the selected block are raised successfully above Vtoff 614, the first row address is selected 616 and first column address is selected 617 to perform a reverse program operation.

Continuing to refer to FIG. 7A, next a reverse program operation 618 is performed on the first row. The reverse program operation decreases the Vt of the selected cells and −15v is coupled to the first word line WL0(0) with 0V coupled the main bit lines BLn and BLn+1) of the selected Block 0. Since Vdd is applied on BT1(0) and BT2(0) transistors T0–T3 are turned on coupling )v to the bit lines of the selected cells. After a predetermined time for reverse program, the selected word line is coupled to Vrpgmvfy to perform a reverse program verify operation 620. A bit-by-bit reverse program verify 622 is accomplished without leakage current since all the unselected memory cells along a common local bit line are in an off-state under 0V bias. The selected main bit line (BLn+1) is set at +1V and the unselected main bit line BLn is coupled to 0V. Any cell with a Vt above Vtmax is considered a failure of the reverse program and the reverse program operation 618 is repeated. Once the reverse program verify succeeds, the reverse program verify operation is then continued to next column 626, and the reverse program verify operation continues until the last cell of the row is reverse programmed 624.

Referring to FIG. 7B, once the cells in the selected block are successfully reversed programmed, the cells are checked for an over erase state where Vt<Vtmin. A correction counter 628 is initialized and the first column address is selected 630. A correction verify operation 632 is performed. During the bit-by-bit correction verify, a positive pulse Vcorvfy is coupled to the selected row WL0(0) of addressed cells while 0V is coupled to the unselected rows WL1(0) through WL511(0) in the selected Block 0 which prevents leakage current. The selected main bit line BLn+1 and bit line select transistor BT2(0) are biased at 1V and Vdd, respectively. The unselected main bit line BLn as well as unselected BT1(0) are set to 0V. If the threshold voltage of the selected cell is Vt<Vtmin 634, then a correction pulse 636 is coupled to the selected cell to raise the Vt of the cell. If the Vt of all bits in the addressed cell is higher than Vtmin 634, the cells are considered properly reverse programmed and no correction is needed. The next cell will be selected for correction verify as this process continues until the last cell on the selected row is reached 642. During the bit-by-bit correction verify, if Vt of any bit in the addressed cell is found to be less than Vtmin, the cell receives correction operation 636. During the bit-by-bit correction, a positive pulse Vcorr is applied to the row WL0(0) of the addressed cell. The unselected rows WL1(0) through WL511(0)) in selected Block 0 remain biased to 0V and do not produce any significant leakage current. All unselected rows in the unselected Block n are set to 0V. In the selected Block 0, the source lines SL(0) is set to 0V as well as BT1(0). The selected main bit line BLn+1 is couple to +5v with BT2(0) line at 0V while the unselected bit line BLn is grounded. Thus, only the selected bits on the addressed cell receive the correction. After the correction, the cell is verified again. Each time the addressed cell fails correction verify, it goes through the iterative correction operation with slightly increased Vcorr. The device is considered failed 640 if a particular addressed cell fails the correction verify and iterative correction after a certain count limit 638, for example "500". After passing bit-by-bit correction verification 634, the next column 644 will be selected for the correction operation. At the end of the last column 642 of the selected row, if all cells pass correction the next reverse program and correction operation will be performed on the next row 648 until the last row 646 is accessed.

Figure 8:
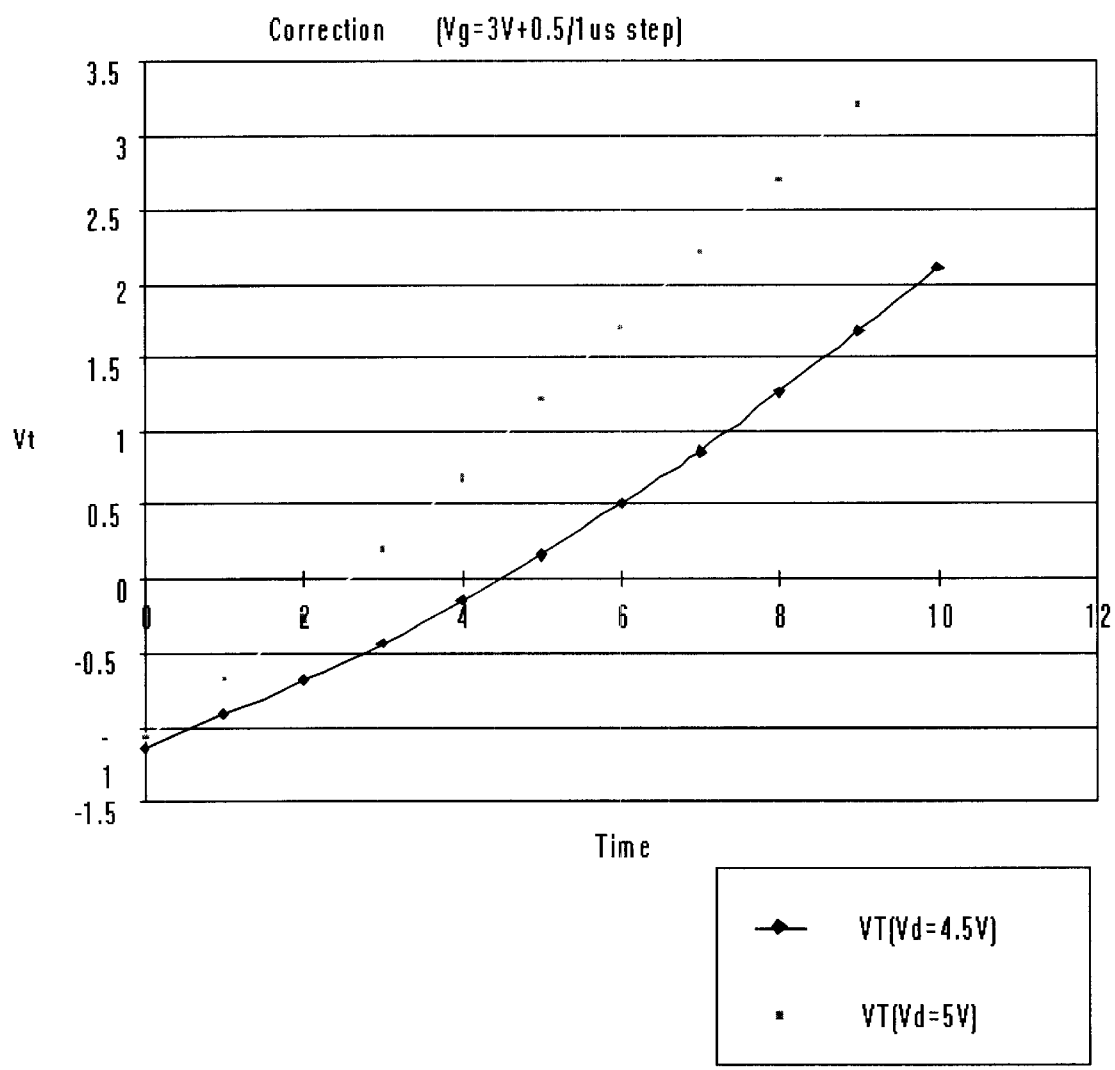
FIG. 8 is graph of Vt vs. time of a step-ramped gate voltage (Vg) of the present invention for correcting the over erased cell.

FIG. 8 shows a graph of threshold voltage Vt versus time at a step-ramped control gate voltage Vg of the present invention. By utilizing a hot carrier injection mechanism, the initial voltage on the word line is set to 3v and the drain voltage is set to 4.5V or 5V. After each 1 us, the correction pulse on the control gate is increased by 0.5V per step, and the depletion state of the cell can be corrected back to on state within 5 us.

Figure 9A:
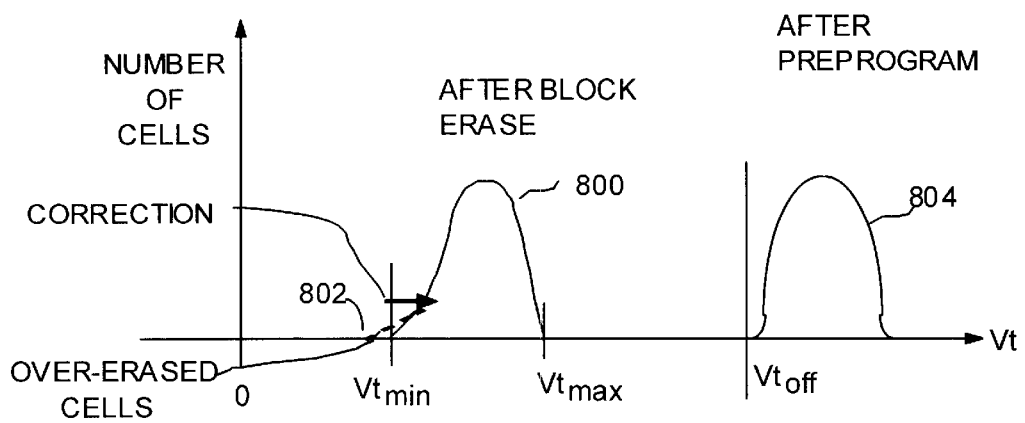
FIG. 9A is a graph of the Vt distribution after erasure in a typical flash memory device of prior art.

FIG. 9A shows a graph of the Vt distribution after erasure 800 and after preprogram 804 in a typical flash memory device of prior art. A higher Vtmax is used to prevent over erased cells. This causes a boosting voltage on the selected word line of a memory device to consume high power while accessing the memory during the read operation. This will also push the Vtoff to higher level also. As a result there will be peak power consumption under high electrical field when erasing caused by the floating gate of memory cells having most negative charge. Data retention will be very critical after cycling and temperature bias. Over erased cells 802 are corrected to have a voltage threshold Vt>Vtmin.

Figure 9B:
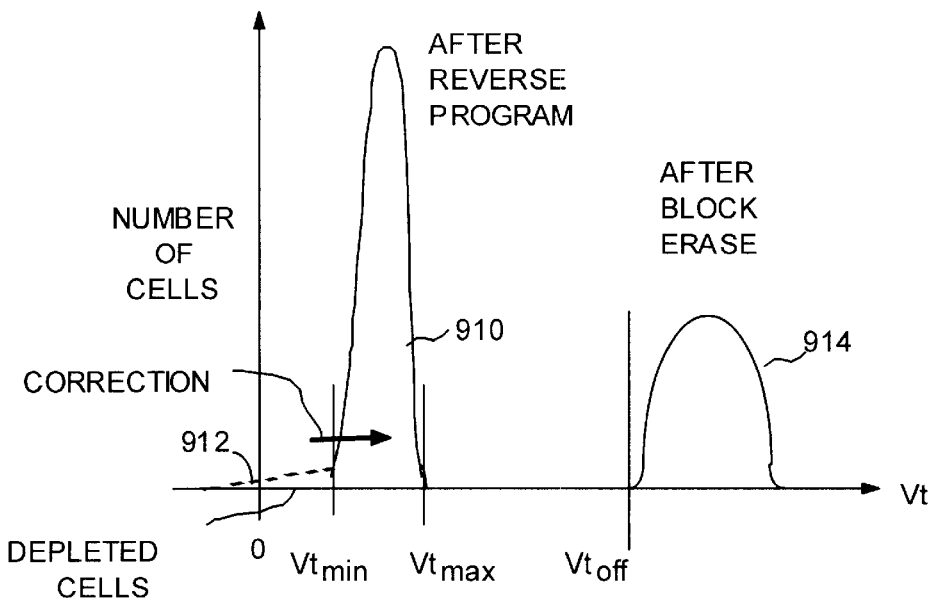
FIG. 9B is a graph of Vt distribution after erasure in a flash memory device of the present invention.

In FIG. 9B is shown a graph of Vt distribution after erasure 914 and reverse program 910 in a flash memory device of the present invention. By utilizing a hot carrier injection mechanism in the correction operation, as shown in FIG. 8, a tightening of the Vt distribution is achieved. The lower Vtmax can obtain enough read current without boosting scheme since there is no leakage from unselected cells. This reduces power significantly during a read operation. Over erased, or depleted, cells 912 are corrected to have a Vt that is greater than Vtmin by a correction operation.

Figure 10:
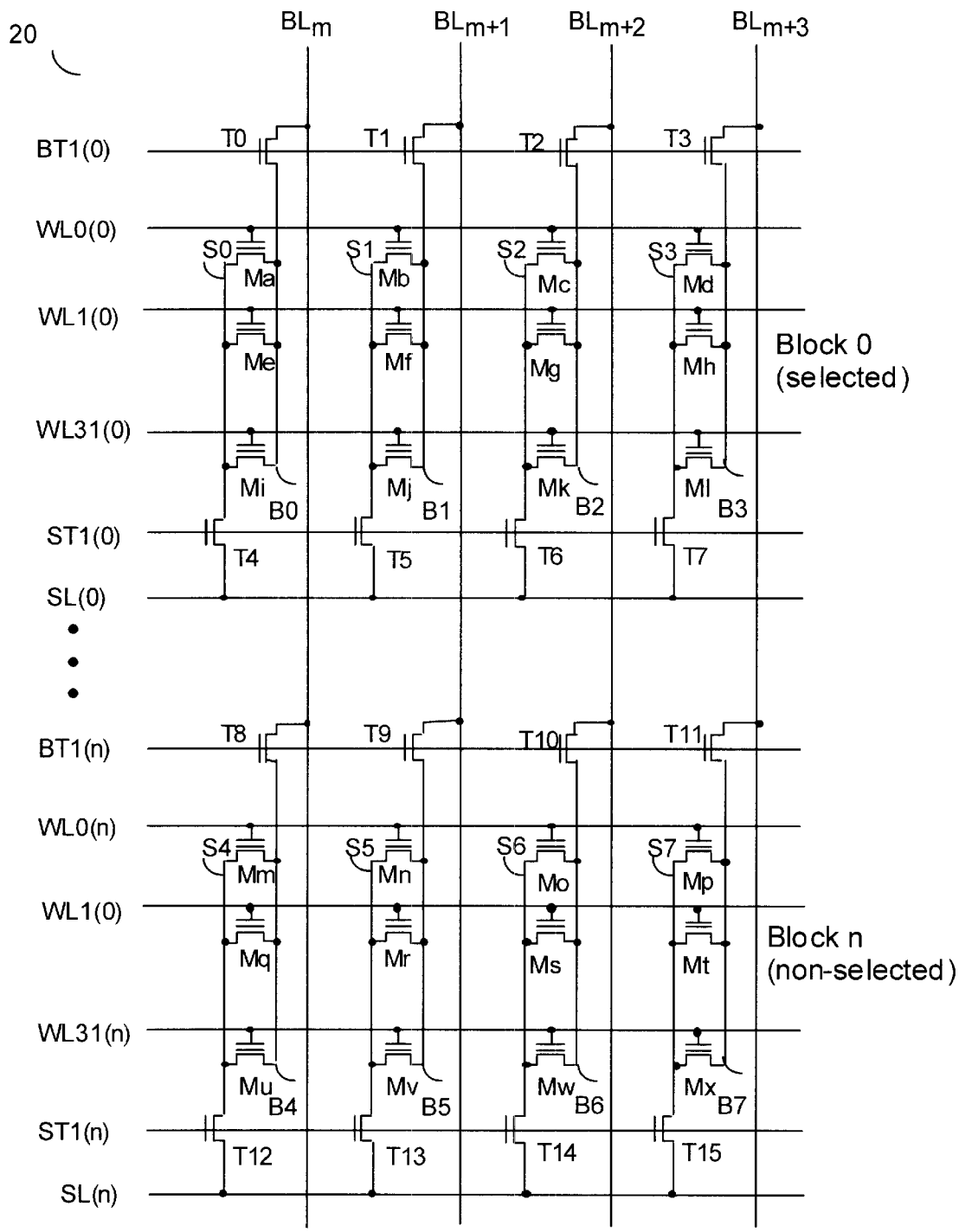
FIG. 10 shows an AND-type NOR array on P-substrate for selected and non-selected blocks in the present invention.

FIG. 10 shows an AND-type NOR array 20 that has a plurality of cells arranged in plurality of rows or pages (word lines) and columns or bit lines (BLm, BLm+1, BLm+2, BLn+3). The control gates of cells in a row connect and a page. The AND-type NOR array is divided into blocks or sectors, each consisting of one or more pages or rows. Sources of cells in the same block share one common source line (SL0, SLn) through the source line select transistors (T4–T7, T12–T15). The drain of each cell in the same block is connected to the global main bit lines (BLm, BLM+1, BLM+2, BLM+3) by the bit line select transistors BT1(n). It should be noted that block 0 is designated as the selected block, and block n as a non-selected or unselected block.

In FIG. 11 is shown a table of bias conditions according to the present invention applied to word lines, bit lines and source lines of an AND-type NOR flash array during different operations comprising erase, erase verify, reverse program, reverse program verify, correction verify and correction. In erase and erase verify operations, cells Ma through M1 are selected. The bit line selector transistors are turned on by BT1(0)=Vdd which connect the drains of the cells to 0V. Word lines WL0(0) through WL31(0) are coupled to +15V which erases all cells to have a Vt>Vtoff. During erase verify the global bit lines BLm, BLm+1, BLm+2 and BLm+3 are coupled to +1V which is connected to the drains of all cells in block 0 by the bit line selector switches T0 through T3 controlled by BT1(0)=Vdd. A source line voltage is coupled to the sources of the cells in block 0 by ST1(0)=Vdd which turns on the source line control transistors T4 through T7. A voltage Versvfy is coupled to each of the word lines in block 0 which allows detection of any of the cells that have a Vt below the minimum erased level Vtoff.

Continuing to refer to FIG. 11, in reverse program, reverse program verify and correction verify, cells Ma, Mb, Mc and Md are selected. In the reverse program operation bit lines B0 through B3 are connected to 0V by means of the switches T0 through T3 being controlled to be on by BT1(0)=Vdd. The source line SL(0) is coupled to 0V through switches T4 through T7 controlled by ST1(0)=Vdd. The selected word line WL0(0) is coupled to −15V to decrease the Vt of the cells to below Vtmax. The remainder of the word lines in block o are coupled to 0V to prevent the cells on these word lines from being disturbed. The cells in the non selected blocks are biased to 0V or are floating to prevent any disturb conditions.

Continuing to refer to FIG. 11, in the reverse program verify operation the bit lines B0 through B3 are coupled to +1V by means of switches T0 through T3 being controlled to be on by BT1(0)=Vdd. The source line SL(0) is coupled to 0V through switches T4 through T7 controlled by ST1(0)=Vdd. The selected word line WL0(0) is coupled to Vrpgmvfy to determine if the Vt of the cells is below Vtmax. The remainder of the word lines in block 0 are coupled to 0V to prevent the cells on these word lines from being disturbed. The cells in the non selected blocks are biased to 0V or are floating to prevent any disturb conditions.

Continuing to refer to FIG. 11, in the correction verify operation the bit lines B0 through B3 are coupled to +1V by means of switches T0 through T3 being controlled to be on by BT1(0)=Vdd. The source line SL(0) is coupled to 0V through switches T4 through T7 controlled by ST1(0)=Vdd. The selected word line WL0(0) is coupled to Vcorvfy to determine if the Vt of the cells is above Vtmin. The remainder of the word lines in block 0 are coupled to 0V to prevent the cells on these word lines from being disturbed. The cells in the non selected blocks are biased to 0V or are floating to prevent any disturb conditions.

Continuing to refer to FIG. 11, in the correction operation only cells Ma and Mc are corrected in block 0. Cells Mb and Md are inhibited from correction. In the correction operation the bit lines B0 and B2 are coupled to 0V by means of switches T0 and T2 being controlled to be on by BT1(0)=+10V. Bit lines B0 and B2 are coupled to +5V by means of switches T1 and T3 being controlled to be on by BT1(0)=+10V. The selected word line WL0(0) is coupled to Vcorr to increase the Vt of over erased cells to be above Vtmin. The remainder of the word lines in block 0 are coupled to 2.5V to prevent the cells on these word lines from being disturbed. The cells in the non selected blocks are biased to 0V or are floating to prevent any disturb conditions.

Figure 12A:
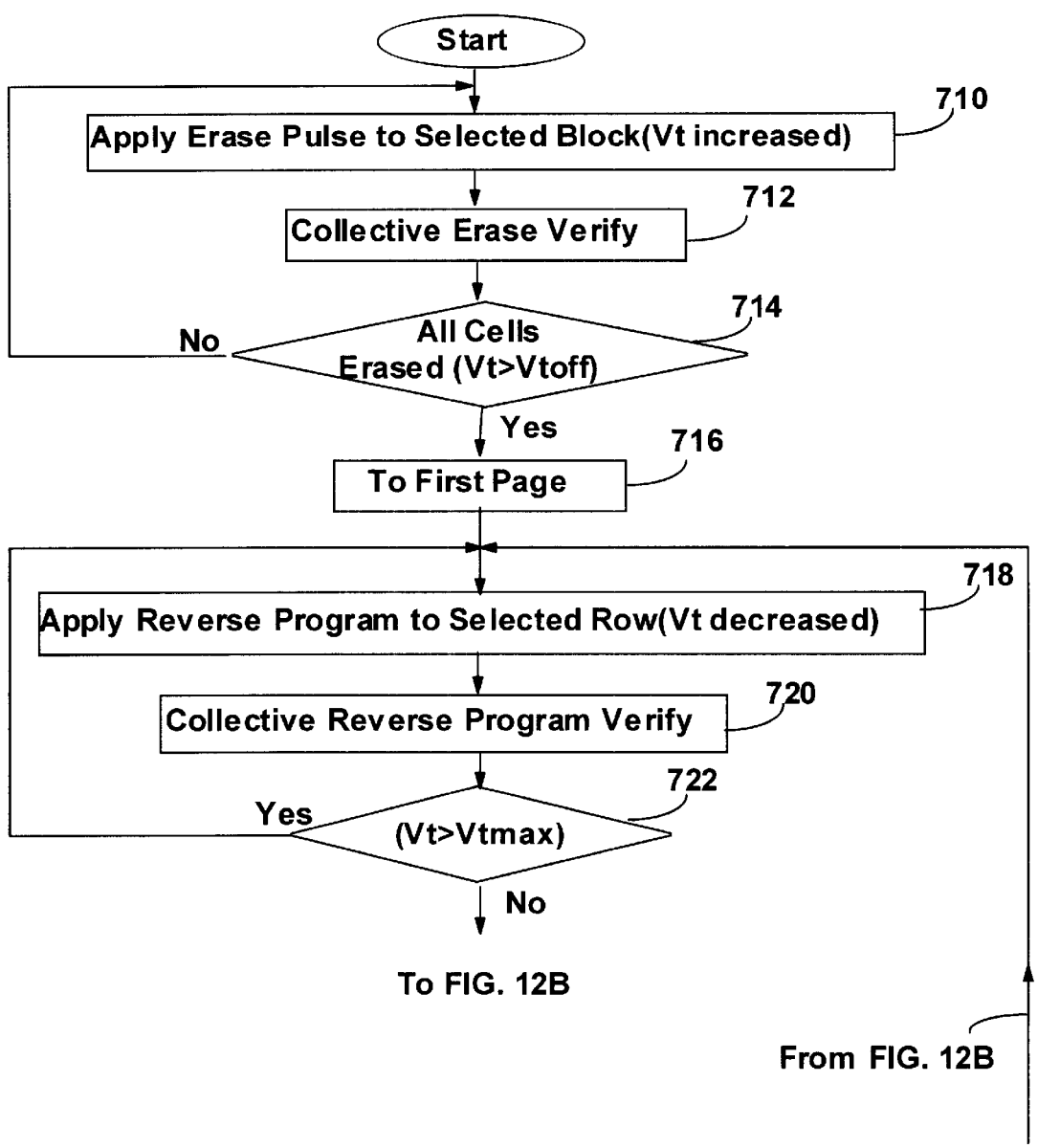
FIGS. 12A and 12B illustrate a flow chart for erase, reverse program, and correction for the present invention as applied to the AND-type NOR array of FIG. 10.
Figure 12B:
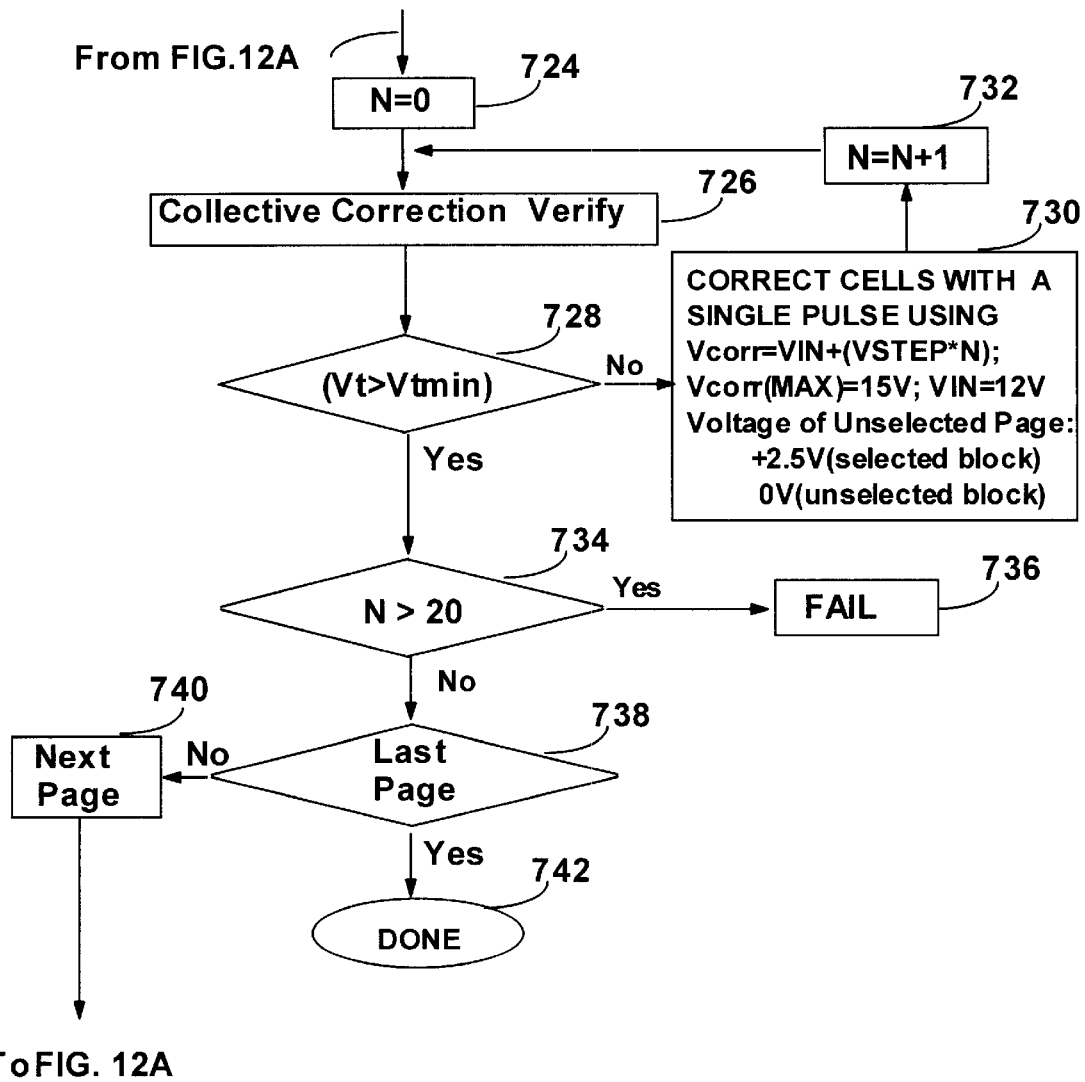

FIGS. 12A and 12B show a flow diagram of the method of erase, collective erase verify, reverse program, reverse program verify, correction verify and correction of the memory cells of an AND-type NOR flash array according to the invention. As discussed in FIG. 10, during all operations the cells in the unselected block n are coupled to 0V by means of voltages on word lines WL1(n) through WL31(n), bit lines B4 through B7, source lines SLn and switch control BT1(n) and ST1(n). In FIG. 12A, an initial block erase operation 710 is performed with +15v applied to the word lines and 0V applied the main bit lines, BLm, BLm+1, BLm+2, BLm+3 of the selected block 0 with the selected source line SL(0) is at 0V. Since Vdd is applied to turn on transistors T0 through T3 and 0V is applied to turn off transistors T4 through T5, the drains and sources of cells in the selected block 0 are grounded. After initial erasure, all word lines in block 0 are to a predetermined voltage level Versvfy 712. Since it is a collective erase verify, all main bit lines are set at 1V and BT1(0) is at Vdd level to turn on transistors T0–T3. The selected source line SL(0) is grounded and the select transistors T4–T7 are turned on by the applied Vdd on ST1(0). If the Vt of all the memory cells in the selected block are greater than Vtoff and reach an off-state 714, then the first page address is set in 716. Otherwise, an erasure is performed again and the process continues until all cells have a Vt greater than Vtoff.

Continuing to refer to FIG. 12A, once all the cells have a Vt>Vtoff, an initial reverse program 718 is performed on the first word line or row where −15v is applied to word line WL0(0) and 0V is applied to the source lines and bit lines. Next, after a predetermined time for reverse program, the word line WL0(0) is coupled to a predetermined voltage level Vrpgmvfy 720. A bit-by-bit reverse program verify is carried out without any affects of background leakage current from the unselected memory cells along the common local bit line which are controlled off under a 0V bias. Since it is a collective erase verify, all main bit lines are set at 1V and BT1(0) is at Vdd level to turn on transistors T0–T3. The selected source line SL(0) is grounded and the select transistors T4–T7 are turned on by the applied voltage Vdd on ST1(0). If Vt of any bit in the selected page is above Vtmax 722, the page is considered to need a further reverse program operation. If the Vt of any bit in the selected page is below Vtmax, the page passes the check, and the subsequent process step of 726 is performed.

Referring to FIG. 12B, next a correction counter is initialized 724, and a correction verify is performed 726. During the collective correction verify, a positive pulse Vcorvfy is coupled to the selected row WL0(0) of the addressed cells while 0V is applied to the unselected rows WL1(0) through WL31(0). All bit lines BLm, BLm+1, BLm+2 and BLm+3 are biased at +1V, and bit line select transistors BT1(0) and source line select transistors ST1(0) are biased at Vdd. If Vt of all bits in the addressed page are more than Vtmin 728, the cells are considered as the properly reverse programmed and do not need correction. In this case, the next page will be selected for reverse program. During the collective correction verify, if Vt of any bit in the page is found to be less than Vtmin, the cell is rendered a depletion-state cell and receives correction operation 730, and the correction counter is stepped 732.

Continuing to refer to FIG. 12B, during the correction operation, those bits that pass correction verify will be inhibited from any further correction. A positive pulse Vcorr is applied to the page WL0(0) while the unselected pages WL1(0) through WL31(0) are set to 2.5V to reduce the disturb between word lines and bit lines/source lines 730. All unselected rows in the unselected block n are set at 0V. In the selected block 0, the source lines SL(0) are set to 0V and the control line ST1(0) is set to 0V. The selected main bit lines BLm and BLm+2 which contain depletion-state bits (Vt<Vtmin) are set to 0V, and the unselected main bit lines BLm+1 and BLm+3 are set at 5V with BT1(0) set at +10V to turn on bit line transistors T0–T3. The control signal ST1(0) is set to 0V to turn off transistors T4–T7 and floating all local source lines S0–S3. After each correction, the correction counter is incremented, and bits on the corrected page are collectively verified again. Each time the addressed page fails correction verify, it goes through the iterative, collective corrective operation with a slightly higher Vcorr.

Continuing to refer to FIG. 12B, the device is considered to be failed 736 if a page fails correction verify and iterative correction after a predetermined count limit, for example, 20 times 734. After passing collective correction verification, the next correction will be performed on the next page 740 until the last page 738 is accessed. The process of identifying and correcting the depleted-state bits back to the on-state bits is then completed 742.

As described herein, the method of erase, erase verify, reverse program, reverse program verify, correction verify and correction by using a three step write operation for the flash EPROM and EEPROM memory cells is reliable and accurate. While only the ETOX type NOR and AND type NOR arrays are discussed, the novel method of the present invention can be used on other flash memory arrays as well as other embodiments and features which can be modified or expanded without leaving departing from the general scope of the present invention.

While the invention has been particularly shown and described with reference to preferred embodiments thereof, it will be understood by those skilled in the art that various changes in form and details may be made without departing from the spirit and scope of the invention.

What is claimed is:

1. A method for erasing a Flash memory, comprising:
   a) applying an erase pulse to increase a threshold voltage of a memory cell of a flash memory,
   b) verifying that the threshold voltage is greater than a first predetermined value after application of said erase pulse,
   c) repeating the application of an erase pulse if the threshold voltage is less than said first predetermined value until said threshold voltage is greater than said first predetermined value,
   d) applying a reverse program to decrease said threshold voltage of said memory cell,
   e) verifying that said threshold voltage is below a second predetermined value after application of said reverse program,
   f) repeating said reverse program if the threshold voltage is greater than said second predetermined value until said threshold voltage is less than said second predetermined value, g) verifying that said threshold voltage is greater than a third predetermined value after said reverse program operation is complete, h) correcting said threshold voltage to be greater than said third predetermined value if said threshold voltage is less than said third predetermined value.

2. The method of claim 1, wherein said memory cell forms a part of an AND flash memory.

3. The method of claim 1, wherein said memory cell forms a part of an ETOX NOR flash memory array.

4. The method of claim 1, wherein applying said erase pulse comprises coupling a high positive voltage to gates of said cells of a block of said memory simultaneously.

5. The method of claim 1, wherein verifying said threshold after said erase to be above a first predetermined value comprises coupling a first predetermined voltage to gates of said cells of a block of said memory simultaneously.

6. The method of claim 1, wherein applying said reverse program comprises applying a high negative voltage to gates of said cells in a selected row of cells of said memory.

7. The method of claim 1, wherein verifying said threshold after reverse program to be below a second predetermined value comprises coupling a second predetermined voltage to one gate of said cells in a selected row of cells of said memory.

8. The method of claim 1, wherein verifying said threshold after reverse program to be above said third predetermined value comprises coupling a third predetermined voltage to one gate of said cells in a selected row of cells of said memory.

9. The method of claim 1, wherein correcting said threshold voltage to be greater than said third predetermined value comprises coupling a variable voltage to one gate of said cells in a selected row of cells of said memory and increasing the value of said variable voltage each subsequent time said one cell said variable voltage.

10. The method of claim 9, wherein said variable voltage is incremented to a higher value each time correction of the threshold voltage is done to be above said third predetermined value is attempted.

11. The method of claim 9, wherein correcting the threshold voltage to be above the third predetermined value allows lower threshold voltages to be set, producing a narrower reverse program voltage distribution and producing a lower power dissipation for said flash memory.

12. An erase means for a nonvolatile flash memory, comprising:

a) a means for increasing a threshold voltage of flash memory cells to a voltage greater than a first predetermined value, b) a means for determining that the threshold voltage of the flash memory cells is above said first predetermined value, c) a means for decreasing the threshold voltage of the flash memory cells below a second predetermined value, d) a means for determining that the threshold voltage of the flash memory cells is below the second predetermined value, e) a means for determining that a means for determining that the threshold voltage of the flash memory cells is above a third predetermined value, f) a means for correcting the threshold voltage of the flash memory cells to be above a third predetermined value and below said second predetermined value.

13. The erase means of claim 12, wherein the means for increasing the threshold voltage to a value above said first predetermined value is accomplished simultaneously on a memory block and is repeated until all cells in said block are above said first predetermined value.

14. The erase means of claim 12, wherein the means for determining the threshold voltage to be above said first predetermined value is accomplished simultaneously on a memory block.

15. The erase means of claim 12, wherein the means for decreasing the threshold voltage to a value below said second predetermined value is accomplished simultaneously on a row of memory cells, and is repeated until all cells in the row are below said second predetermined value.

16. The erase means of claim 12, wherein the means for determining the threshold voltage to be below said second predetermined value is accomplished cell by cell on a row of memory cells.

17. The erase means of claim 12, wherein the means for determining the threshold voltage to be above said third predetermined value is accomplished cell by cell on a row of memory cells.

18. The erase means of claim 12, wherein the means for correcting the threshold voltage to be above said third predetermined value is accomplished cell by cell on a row basis and wherein an applied correction voltage is incremented for each attempt to correct the threshold voltage.

19. The erase means of claim 12, wherein the means for correcting the threshold voltage to be above said third predetermined value allows lower threshold voltages to be set, producing a narrower reverse program voltage distribution and producing a lower power dissipation for said flash memory.

20. A three step erase operation for a flash memory array, comprising:

a) a flash memory array constructed of row and columns of one transistor floating gate cells where rows of said cells are connected to word lines and columns of cells are connected to bit lines, b) said flash memory array partitioned into memory block portions, c) a threshold voltage for all cells in a selected memory block increased to a value greater than a first predetermined voltage level for all cells in said selected block, d) said threshold voltage decreased below said first predetermined voltage level to a value less than a second predetermined voltage level for all cells in said selected block, e) said threshold voltage increased above a third predetermined voltage level and below said second predetermined voltage level for cells in said selected block which have a threshold voltage below said third predetermined voltage level.

21. The three step erase operation of claim 20, wherein a first verification is performed on said selected memory block to determine that the threshold voltage of said memory cells is greater than the first predetermined voltage level.

22. The three step erase operation of claim 20, wherein a second verification is performed on the selected memory block to determine that the threshold voltage of said memory cells is less than the second predetermined voltage level.

23. The three step erase operation of claim 22, wherein a third verification is performed on the selected memory block to determine if any cells in said block have a threshold voltage that is less than the third predetermined voltage level.

24. The three step erase operation of claim 20, wherein the flash memory array is an ETOX NOR array.

25. The three step erase operation of claim 20, wherein the flash memory array is an AND array.

26. A method for a low leakage erase operation for a flash memory array, comprising:
   a) increasing a threshold voltage above a first predetermined voltage level for all cells in a block of flash memory array,
   b) decreasing said threshold voltage below a second predetermined voltage level for all cells in said block by row,
   c) increasing said threshold voltage above a third predetermined voltage level and below said second predetermined voltage level for selected cells in said block.

27. The method of claim 26, wherein decreasing said threshold voltage below said second predetermined value is done by row where all cells in a column and not in said row are it in an off state eliminating bit line leakage current.

28. The method of claim 26, wherein increasing said threshold voltage above said third predetermined value is done by individual cell where all cells in a column and not in said row containing said individual cell are in an off state eliminating bit line leakage current.

29. The method of claim 26, wherein the flash memory array is an ETOX NOR array.

30. The method of claim 26, wherein the flash memory array is an AND array.

31. A method to produce a tightened threshold voltage distribution for a flash memory array, comprising:
   a) increasing a threshold voltage above a first predetermined voltage level for all cells in a block of a flash memory array,
   b) decreasing said threshold voltage below a second predetermined voltage level and below said first predetermined voltage level for all cells in said block by row,
   c) increasing said threshold voltage above a third predetermined voltage level and below said second predetermined voltage level for selected cells in said block to tighten an erased threshold distribution for said memory cells.

32. The method in claim 31, wherein increasing said threshold above a first predetermined voltage level produces a narrow threshold voltage distribution below said second predetermined voltage level with a distribution tail extending below said third predetermined voltage level.

33. The method in claim 32, wherein increasing said threshold voltage above said third predetermined voltage level and below said second predetermined voltage level for selected cells eliminates said distribution tail and further narrows said threshold voltage distribution for erased cells.

34. The method of claim 31, wherein the flash memory array is an ETOX NOR array.

35. The method of claim 31, wherein the flash memory array is an AND array.

36. A method to correct a threshold voltage distribution, comprising:
   a) initializing a correction counter,
   b) determining a threshold voltage of a cell in a block of a flash memory array to be below a predetermined voltage level,
   c) applying a correction voltage to a gate of said cell if said threshold voltage of the cell is below said predetermined voltage level, then incrementing said correction counter and returning to step b), else continuing,
   d) failing said flash memory array if said correction counter is above a predetermined count, else continuing.

37. The method of claim 36, wherein said correction voltage is increased to a higher value each time said correction counter is incremented.

38. The method of claim 36, wherein the flash memory array is an ETOX NOR array.

39. The method of claim 36, wherein the flash memory array is an AND array.

* * * * *